US006932916B2

United States Patent
Manger et al.

(10) Patent No.: US 6,932,916 B2
(45) Date of Patent: Aug. 23, 2005

(54) SEMICONDUCTOR SUBSTRATE WITH TRENCHES OF VARYING DEPTH

(75) Inventors: Dirk Manger, Dresden (DE); Hans-Peter Moll, Dresden (DE); Till Schloesser, Dresden (DE)

(73) Assignee: Infineon Technologies AG, Munich (DE)

( * ) Notice: Subject to any disclaimer, the term of this patent is extended or adjusted under 35 U.S.C. 154(b) by 34 days.

(21) Appl. No.: 10/425,179

(22) Filed: Apr. 29, 2003

(65) Prior Publication Data

US 2004/0029385 A1 Feb. 12, 2004

(30) Foreign Application Priority Data

Apr. 30, 2002 (DE) .......................... 102 19 398

(51) Int. Cl.[7] .................... B44C 1/22; H01L 21/302
(52) U.S. Cl. ...................... 216/62; 216/72; 216/95; 438/705; 438/717; 438/740
(58) Field of Search .................. 216/47, 49, 51, 216/62, 72, 95; 438/700, 705, 717, 736, 740

(56) References Cited

U.S. PATENT DOCUMENTS

| 4,139,442 | A | * | 2/1979 | Bondur et al. .......... 438/427 |
| 5,824,595 | A | | 10/1998 | Igel et al. .............. 438/464 |
| 5,972,789 | A | | 10/1999 | Jeng et al. ............. 438/637 |
| 6,458,494 | B2 | * | 10/2002 | Song et al. ............... 430/5 |
| 6,596,608 | B2 | * | 7/2003 | Saito ..................... 438/424 |
| 6,605,540 | B2 | * | 8/2003 | Ali et al. ............... 438/694 |
| 2003/0077875 | A1 | * | 4/2003 | Mandelman et al. ..... 438/424 |
| 2004/0023467 | A1 | * | 2/2004 | Karpov et al. .......... 438/427 |

FOREIGN PATENT DOCUMENTS

| JP | 63-208219 | * | 8/1988 |
| JP | 02-246330 | * | 10/1990 |
| JP | 07-066276 | * | 3/1995 |
| JP | 09-069608 | * | 3/1997 |
| JP | 11-045874 | * | 2/1999 |

* cited by examiner

Primary Examiner—George A. Goudreau
(74) Attorney, Agent, or Firm—Fish & Richardson P.C.

(57) ABSTRACT

A method for etching trenches having different depths on a semiconductor substrate includes providing a mask with first and second openings. The first and second openings are located where corresponding first and second trenches are to be etched. A slow-etch region, made of a slow-etch material, is provided above the substrate at a location corresponding to the second opening. When exposed to a selected etchant, the slow-etch material is etched at a rate less than the rate at which the semiconductor substrate is etched when exposed to the selected etchant.

7 Claims, 5 Drawing Sheets

SEMICONDUCTOR SUBSTRATE WITH TRENCHES OF VARYING DEPTH

FIELD OF INVENTION

The present invention relates to a Fabrication method for a trench arrangement with trenches of different depth in a semiconductor substrate by means of an etching process using a mask provided on the semiconductor substrate.

RELATED APPLICATIONS

This application claims the benefit of the Apr. 30, 2002 priority date of German application 102.19.398.3, the contents of which are herein incorporated by reference.

BACKGROUND

Although applicable to any desired integrated circuits, in principle, the present invention and the problem area on which it is based are explained with regard to integrated circuits in silicon technology.

It is generally known that, in particular in semiconductor memory devices, such as e.g. DRAMs (Dynamic Random Access Memory), trenches are provided in order to form storage capacitors therein. Furthermore, trenches are generally required in integrated circuits in order to form an isolation between different components or component regions.

It is often necessary to produce trenches of different depth in a substrate. One possibility for producing such trenches of different depth consists in producing the trenches by means of different critical lithography steps.

However, this possibility has the crucial disadvantage that at least two critical lithography steps are required, which increases the susceptibility to faults and reduces the yield in the process. The critical lithography steps limit the throughput and are expensive. A reduction of costs is therefore sought.

Therefore, it is an object of the present invention to provide an improved fabrication method for a trench arrangement in a semiconductor substrate, whereby trenches of different depth can be fabricated more simply.

The idea on which the present invention is based consists in a region made of a material which has a reduced etching rate—compared with the semiconductor substrate—during the etching process being provided in specific mask openings above the semiconductor substrate.

A particular advantage of the present invention is that trenches of different depth can be produced in an integrated etching process step.

In accordance with one preferred development, the region is provided below a photoresist mask.

In accordance with a further preferred development, the region is provided within or below a hard mask.

In accordance with a further preferred development, the region is formed by a layer made of the material being deposited on the semiconductor substrate and subsequently being patterned photolithographically.

In accordance with a further preferred development, before the application of the mask, provision is made of a planarization layer for planarizing the semiconductor substrate with the region.

In accordance with a further preferred development, the planarization layer is an antireflection layer.

In accordance with a further preferred development, the region is provided as a remaining part of a hard mask, in which the second opening is not opened right through.

In accordance with a further preferred development, the etching process is a single-stage etching process.

In accordance with a further preferred development, the etching process is a two-stage etching process, the region forming an etching stop in a first selective etching stage and subsequently being removed in a second non-selective etching stage.

In accordance with a further preferred development, an additional etching stop layer is provided on the entire surface of the semiconductor substrate, which layer forms an etching stop in the first opening in the first selective etching stage and is subsequently removed in the second non-selective etching stage.

Exemplary embodiments of the invention are illustrated in the drawings and are explained in more detail in the description below.

BRIEF DESCRIPTION OF THE DRAWINGS

In the figures.

In the figures, identical reference symbols designate identical or functionally identical constituent parts.

DETAILED DESCRIPTION

FIGS. 1a–c are diagrammatic illustrations of the essential method steps for fabricating a trench arrangement in a semiconductor substrate for an integrated circuit in silicon technology as first embodiment of the present invention.

Figure 1:
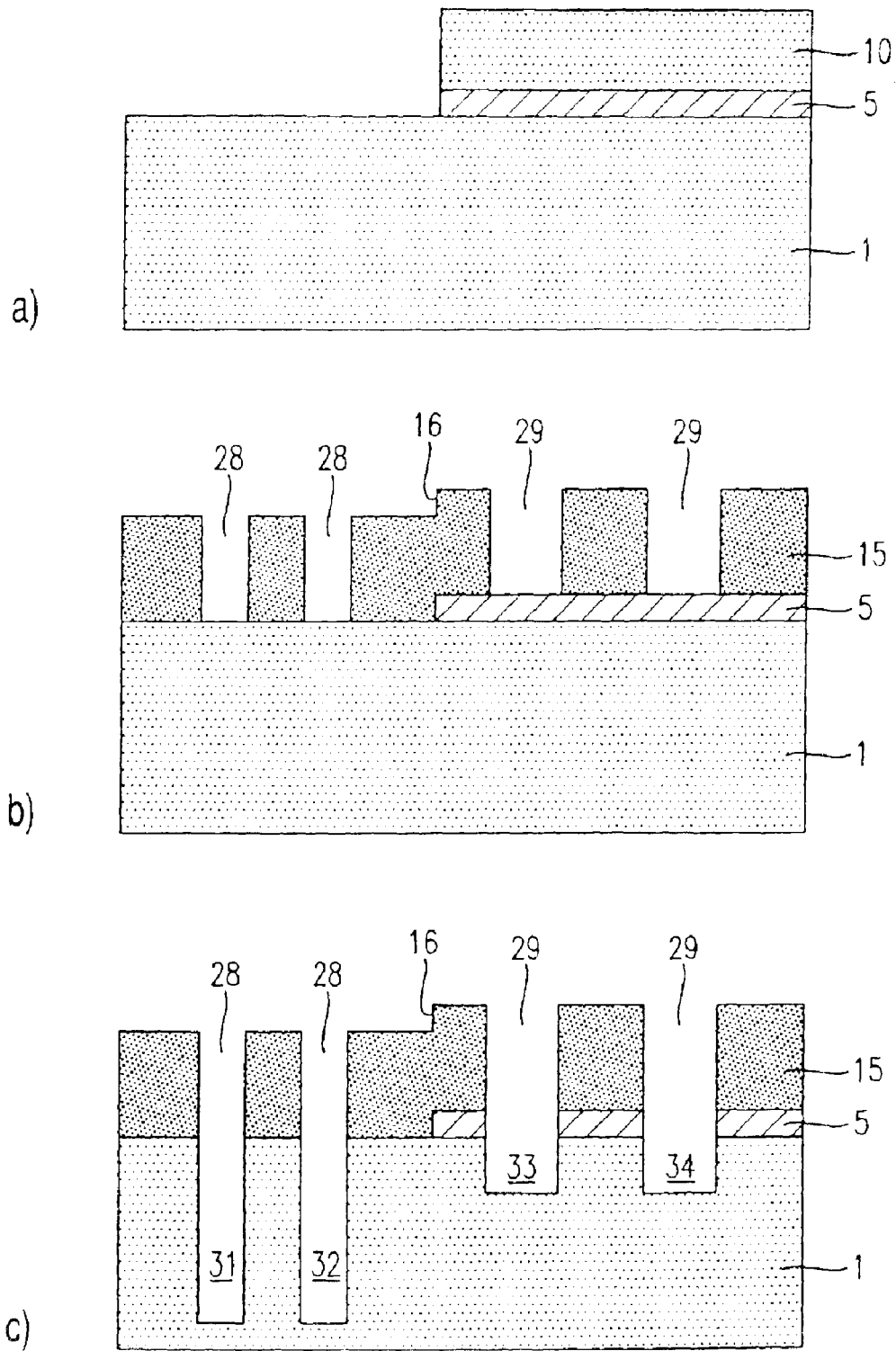
FIGS. 1a–c show diagrammatic illustrations of the essential method steps for fabricating a trench arrangement in a semiconductor substrate for an integrated circuit in silicon technology as first embodiment of the present invention.

In FIG. 1, reference symbol 1 designates a semiconductor substrate in which, by way of example, an integrated circuit or parts thereof (not illustrated) may already be provided. In the present example, the semiconductor substrate 1 is a silicon semiconductor substrate.

In a first step, a layer 5 is deposited onto the semiconductor substrate 1, which layer has a reduced etching rate—in comparison with the semiconductor substrate 1—for a predetermined selective silicon etching process. In the present example, the material of the layer 5 is silicon nitride.

In a subsequent process step, a photomask 10 is provided on the layer 5 provided over the whole area and the layer is patterned therewith by means of a customary etching step, for example a reactive ion etching step or a wet-etching step, which leads to the process state shown in FIG. 1a.

With reference to FIG. 1b, a photoresist mask 15 is then formed on the resulting structure in a further process step, which mask has first openings 28 directly above the semiconductor substrate 1 and second openings 29 above the patterned region of the layer 5.

Although it is possible, in principle, to provide a planarization step, for example by means of an antireflection coating or some other planarization layer, before the application of the photomask 15, this is not illustrated in the present exemplary embodiment, which leads to the formation of a step 16, but the latter generally does not disturb the subsequent etching process.

With reference to FIG. 1c, in a subsequent etching step, trenches 31, 32 and 33, 34 are formed in the semiconductor substrate 1 by means of the openings 28, 29, respectively, to be precise for example by a selective reactive ion etching process which has a higher etching rate for the silicon semiconductor substrate 1 than for the region 5 made of silicon nitride. This leads to a reduced etching depth of the trenches 33, 34 in the region of the second openings 29, where the etching rate is slowed down in the etching process during the removal of the region 5 made of silicon nitride.

In subsequent process steps (not illustrated), the photoresist mask 15 can then be stripped and the region 5 can be removed selectively with respect to the semiconductor substrate, which finally results in a semiconductor substrate 1 with two pairs of trenches 31, 32 and 33, 34, respectively, of different depths.

A brief theoretical consideration of the requirements imposed on the layer 5 made of the material with the reduced etching rate shall be given below.

As stated, the etching rate of the layer 5, designated here as $R_1$, must be less than the etching rate of the substrate material (silicon) to be patterned, designated here as $R_2$, in other words $R_1 < R_2$ must hold true.

The selectivity S of the etching process is defined as the ratio of the etching rates $R_1$ and $R_2$, in other words $S = R_1 : R_2$ holds true.

Assuming that the thickness of the layer 5 is a and the etching depth is $Z_{1/2} = R_{1/2} \times$ etching time, the following holds true for the depth difference D:

$$D = Z_2 - Z_1 = (R_2 - R_1) \times \text{etching time.}$$

If the layer 5 has been etched through, the maximum depth difference is obtained as $D_{max} = (S-1) \times a$.

Figure 2:
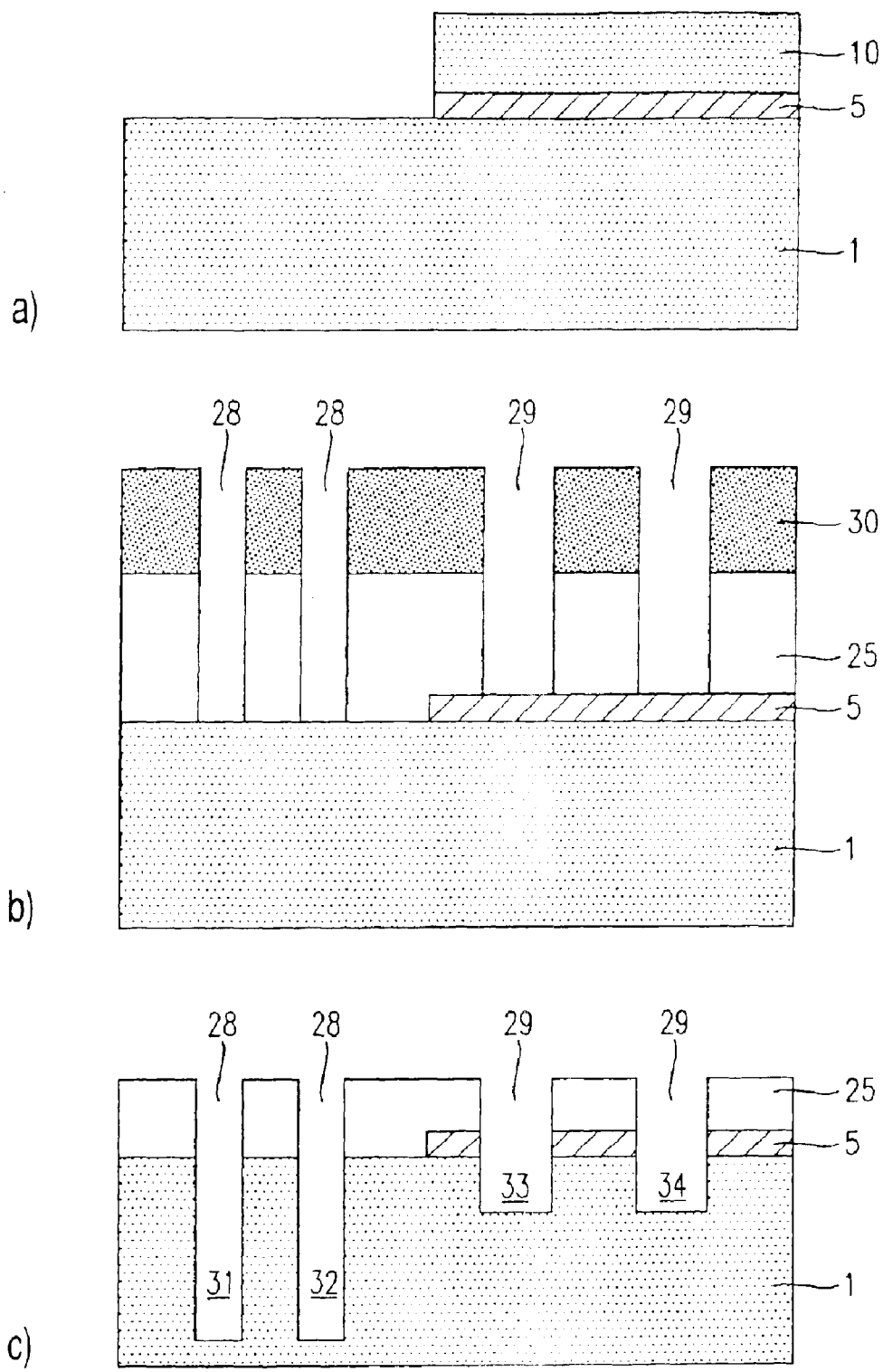
FIGS. 2a–c show diagrammatic illustrations of the essential method steps for fabricating a trench arrangement in a semiconductor substrate for an integrated circuit in silicon technology as second embodiment of the present invention.

FIGS. 2a–c are diagrammatic illustrations of the essential method steps for fabricating a trench arrangement in a semiconductor substrate for an integrated circuit in silicon technology as second embodiment of the present invention.

In the case of the second embodiment, the process state shown in FIG. 2a is attained by means of the analogous process step which have [sic] already been explained above with reference to FIG. 1a.

With reference to FIG. 2b a hard mask 25, for example made of BPSG, is then deposited on the semiconductor substrate 1 with the region 5 and the hard mask 25 is patterned using a photoresist mask 30 with openings 28 and 29 directly above the substrate region and above the region 5, respectively. During this patterning step, the corresponding etching process stops on the semiconductor substrate 1 in the openings 28 and on the region 5 in the openings 29.

In a subsequent etching step, for example by reactive ion etching, in a manner analogous to the first embodiment above, a structure is fabricated in which the trenches 31, 32 in accordance with the openings 28 have a larger etching depth than the trenches 33, 34 in accordance with the openings 29. This is caused, as already explained above, by this etching step being slowed down by the region 5 made of silicon nitride. It should be mentioned in this connection that the photoresist mask 30 can either be left on the hard mask in this etching step or can be stripped in a step that is not illustrated.

Finally, the hard mask 25 and the region 5 are removed in a known manner, as already explained above in connection with the first embodiment.

Figure 3:
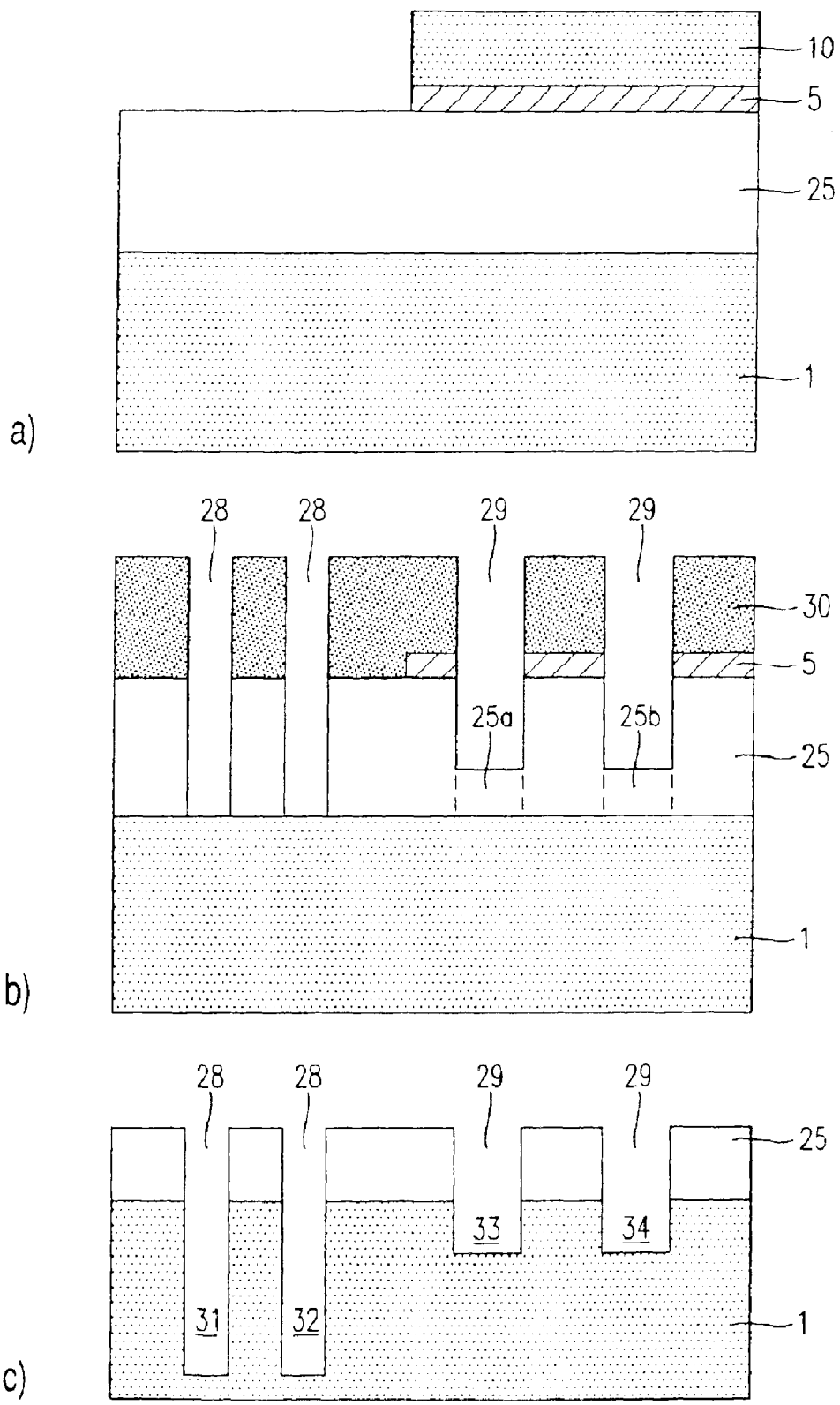
FIGS. 3a–c show diagrammatic illustrations of the essential method steps for fabricating a trench arrangement in a semiconductor substrate for an integrated circuit in silicon technology as third embodiment of the present invention.

FIGS. 3a–c are diagrammatic illustrations of the essential method steps for fabricating a trench arrangement in a semiconductor substrate for an integrated circuit in silicon technology as third embodiment of the present invention.

In the process state explained with reference to FIG. 3a, firstly a hard mask layer 25 made of BPSG is deposited over the whole area of the substrate 1. This is followed by whole-area deposition of the layer 5 with a reduced etching rate and photolithographic patterning of the layer 5 by means of the photomask 10, after which the photomask 10 is stripped.

In a subsequent process step, a further photomask 30 is formed above the resulting structure, which photomask has the first openings 28 above the semiconductor substrate 1 and the second openings 29 above the region 5.

In a subsequent etching step, the hard mask 25 is patterned using the photomask 30, the etching process used for the patterning stopping on the semiconductor substrate 1 in the openings 28 and stopping within the hard mask 25 in the region of the openings 29 on account of the retarding effect of the region 5. In other words, residual regions 25A, 25B of the hard mask 25 remain in the openings 29, or in other words the hard mask 25 is not completely opened in the region of the openings 29.

FIG. 3c illustrates the effect of the subsequent etching step which is used for the purpose of trench formation and before which the photoresist mask 30 is either stripped or left.

On account of the retarding effect of the regions 25A, 25B, trenches 31, 32 are formed in the region of the openings 28, which trenches have a larger etching depth than the trenches 33, 34 in the region of the openings 29.

Finally, as in the rest of the examples, the hard mask 25 is stripped in an optional further process step.

Figure 4:
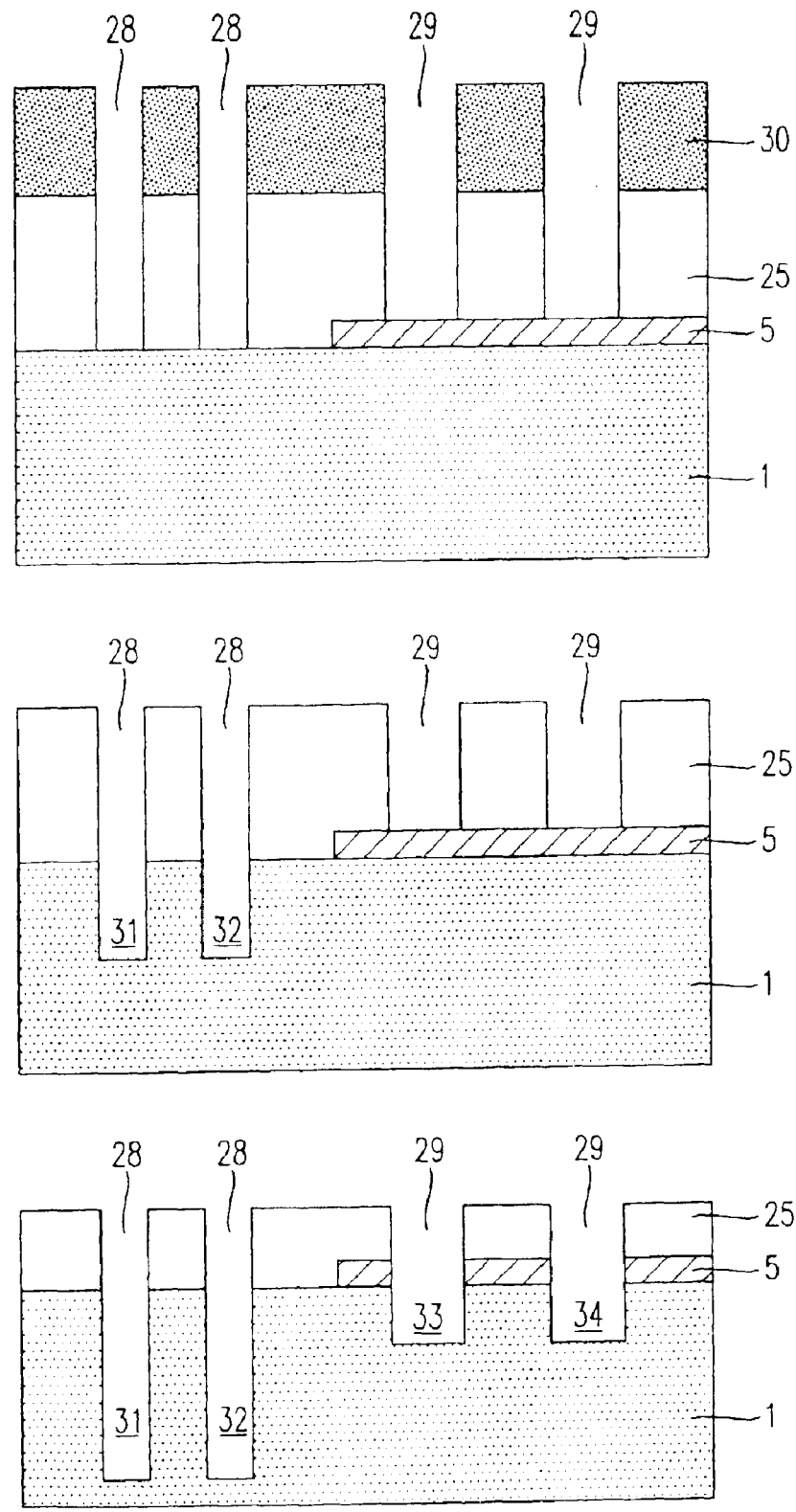
FIGS. 4a–c show diagrammatic illustrations of the essential method steps for fabricating a trench arrangement in a semiconductor substrate for an integrated circuit in silicon technology as fourth embodiment of the present invention.

FIGS. 4a–c are diagrammatic illustrations of the essential method steps for fabricating a trench arrangement in a semiconductor substrate for an integrated circuit in silicon technology as fourth embodiment of the present invention.

The process state shown in FIG. 4a essentially corresponds to the process state in accordance with FIG. 2b, although in this fourth embodiment the region 5 forms an etching stop for the etching step for patterning the silicon semiconductor substrate.

This last becomes clear from the illustration in accordance with FIG. 4b, in accordance with which firstly parts of the trenches 31, 32 are formed in the openings 28, the etching remaining stopped in the openings 29 on account of the presence of the region 5. This first selective etching stage of the substrate etching may likewise be, for example, a reactive ion etching step.

After the trenches 31, 32 have acquired a depth projection, as it were, as a result of this first selective etching stage, it is then possible, as shown in FIG. 4c, to use a second non-selective etching stage for breaking through the region 5 and for etching the substrate 1 further. It is likewise possible, after breaking through the region 5, to switch to the first selective etching process again, that is to say to employ virtually a three-stage etching process.

Analogously to the above embodiments, as required, the hard mask 25 is then stripped and the residue of the region 5 is selectively removed.

Figure 5:
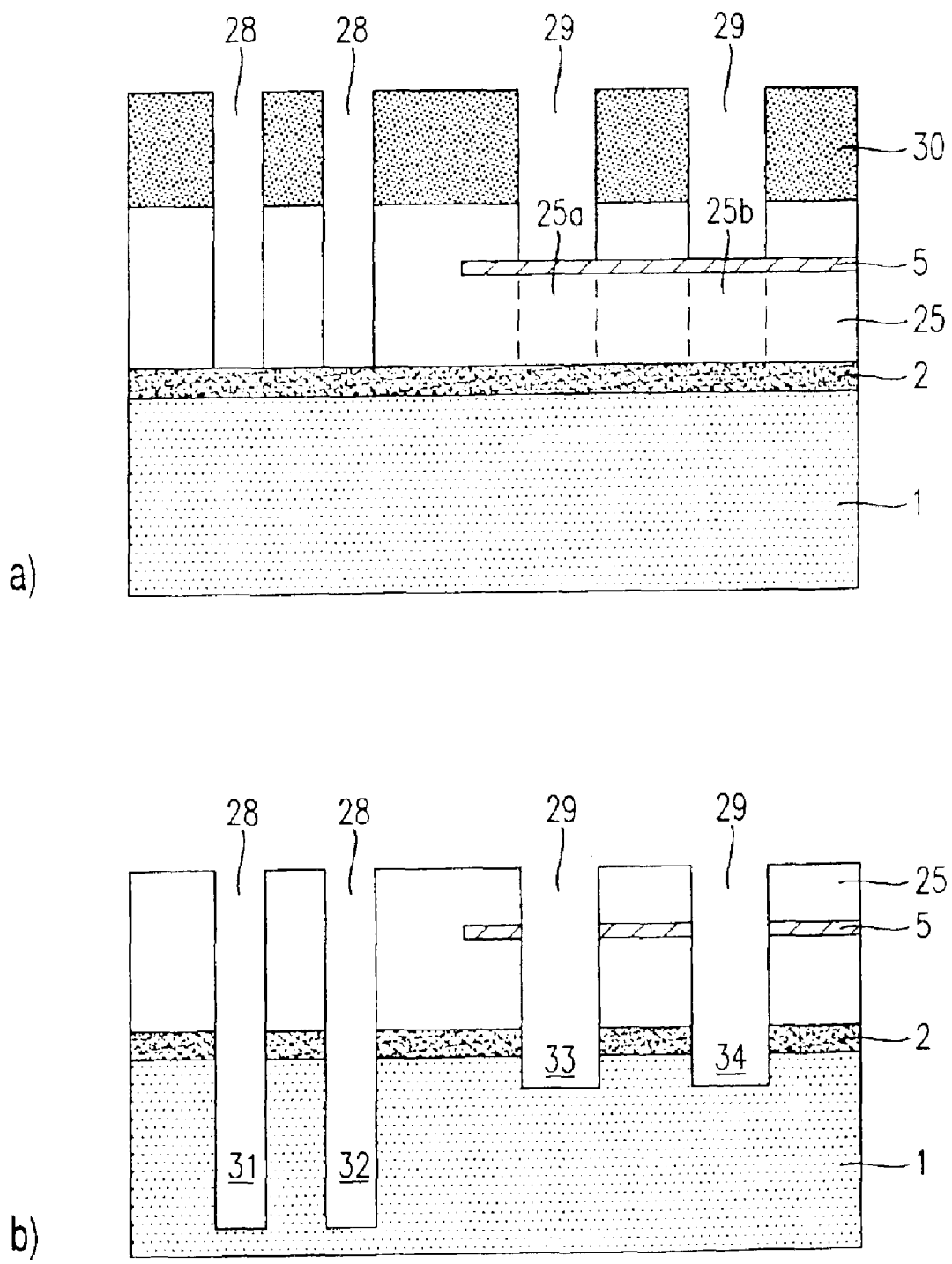
FIGS. 5a, b show diagrammatic illustrations of the essential method steps for fabricating a trench arrangement in a semiconductor substrate for an integrated circuit in silicon technology as fifth embodiment of the present invention.

FIGS. 5a,b are diagrammatic illustrations of the essential method steps for fabricating a trench arrangement in a semiconductor substrate for an integrated circuit in silicon technology as fifth embodiment of the present invention.

In accordance with FIG. 5a, firstly a silicon nitride layer 2 is deposited over the whole area of the semiconductor substrate 1. A part of a hard mask 25 made of BPSG is then deposited over the whole area of the resulting structure. This is followed by whole-area deposition of the layer 5 with a low etching rate and then the patterning thereof, as already explained above.

Afterward, a further part of the hard mask 25 is deposited on the patterned layer 5 and the surrounding regions of the hard mask 25, until the final height of said hard mask has been reached.

A photoresist mask 30 with openings 28 and 29 is then provided, as already explained.

In an etching process for patterning the mask, the openings 28, 29 are then deepened, to be precise the openings 28 as far as the silicon nitride layer 2 and the openings 29 as far as the silicon nitride layer 5.

With reference to FIG. 5b, a non-selective reactive ion etching step down to the target depth is then effected, during which trenches 31, 32 are again formed below the openings 28, said trenches having a larger etching depth than the trenches 33, 34 below the openings 29 since, below the openings 29, it is necessary firstly to remove the remaining parts 25A, 25B of the hard mask 25. In this embodiment, the depth position of the region 5 within the hard mask 20 determines the target depth of the shallower trenches 33, 34.

Although the present invention has been described above using a preferred exemplary embodiment, it is not restricted thereto, but rather can be modified in diverse ways.

In particular, the explanation in connection with integrated circuits in silicon technology is only by way of example.

In this case, Ar/CF and $CHF_3/O_2$ shall be specified only by way of example as etching chemicals for a selective etching of silicon with respect to silicon nitride, and $CF_4$ and $CHF_3/Cl$ shall likewise be specified only by way of example as non-selective etching $Si/SiO_2/Si_3N_4$.

In particular, it shall be mentioned that it is also possible, of course, to provide a plurality of regions one above the other within the second openings in order to determine the target depth of the shallower trenches. Of course, it is also possible to provide not just two different types of openings but, in principle, an arbitrary number of types of openings of a correspondingly arbitrary number of different etching depths.

List of Reference Symbols:

| | |
|---|---|
| 1 | Si s″ubstrate |
| 5 | Silicon nitride layer |
| 10, 15, 30 | Resist mask |
| 28, 29 | Openings |
| 16 | Step |
| 31–34 | Trenches |
| 25 | Hard mask |
| 25a, b | Hard mask layer residue |

What is claimed is:

1. A method for etching trenches on a semiconductor substrate, the method comprising:

providing a mask on the substrate, the mask having a first opening at which a first trench is to be etched and a second opening at which a second trench, having a depth different from a depth of the first trench, is to be etched;

providing, above the substrate at a location corresponding to the second opening, a slow-etch region, the slow-etch region being made of a slow-etch material that, when exposed to a selected etchant, is etched at a rate less than the rate at which the semiconductor substrate is etched when exposed to the selected etchant; and etching selectively until the slow-etch region stops the selective etching, and etching non-selectively to remove the slow-etch region.

2. The method of claim 1, wherein providing a slow-etch region comprises providing a slow-etch region below a photoresist mask.

3. The method of claim 1, wherein providing a slow-etch region comprises providing a slow-etch region below a hard mask.

4. The method of claim 1, wherein providing a slow-etch region comprises depositing the slow-etch material on the semiconductor substrate, and photolithographically patterning the slow-etch material.

5. The method of claim 4, further comprising, before providing the mask, providing a planarization layer for planarizing the semiconductor substrate.

6. The method of claim 5, further comprising selecting the planarization layer to be an anti-reflection layer.

7. The method of claim 1, further comprising providing an additional etch-stop layer on the entire surface of the semiconductor substrate, the etch-stop layer forming an etch stop for the first opening; and removing the etch-stop layer during the non-selective etching step.

* * * * *